United States Patent
Eshita et al.

[11] Patent Number: 5,144,379
[45] Date of Patent: Sep. 1, 1992

[54] SEMICONDUCTOR DEVICE HAVING A GROUP III-V EPITAXIAL SEMICONDUCTOR LAYER ON A SUBSTRATE

[75] Inventors: Takashi Eshita, Ohmorinishi; Toshikazu Inoue, Yokohama, both of Japan

[73] Assignee: Fujitsu Limited, Kawasaki, Japan

[21] Appl. No.: 669,980

[22] Filed: Mar. 15, 1991

[30] Foreign Application Priority Data

Mar. 15, 1990 [JP] Japan ................... 2-65124

[51] Int. Cl.$^5$ ............................... H01L 29/80
[52] U.S. Cl. ........................... 357/22; 357/15; 357/16; 357/61; 357/63
[58] Field of Search ............... 357/22 A, 16, 15, 63, 357/22 I, 22 MD, 22 IC, 61

[56] References Cited

U.S. PATENT DOCUMENTS

| | | | |
|---|---|---|---|
| 4,745,448 | 5/1988 | Van Rees et al. | 357/22 |
| 4,814,838 | 3/1989 | Kuroda et al. | 357/22 |
| 4,827,320 | 5/1989 | Morkoc et al. | 357/22 |
| 4,903,091 | 2/1990 | Baba et al. | 357/22 |
| 4,916,498 | 4/1990 | Berenz | 357/22 |
| 4,987,463 | 1/1991 | Goronkin et al. | 357/22 |

Primary Examiner—Georgia Y. Epps
Attorney, Agent, or Firm—Staas & Halsey

[57] ABSTRACT

A semiconductor device comprises a substrate of a first material, a buffer layer of a second, group III-V semiconductor material provided on the substrate epitaxially, and a barrier layer of a third, group III-V compound semiconductor material different from the first and second materials and having a resistivity substantially larger than the resistivity of the buffer layer. The barrier layer further has a second lattice constant different from the lattice constant of the buffer layer and characterized by a band gap substantially larger than the band gap of the buffer layer. The barrier layer is provided on the buffer layer directly and an active layer of a fourth, group III-V compound semiconductor layer is provided on the barrier layer. On the active layer, an active device is provided such that the active device at least has a part formed in the active layer.

9 Claims, 7 Drawing Sheets

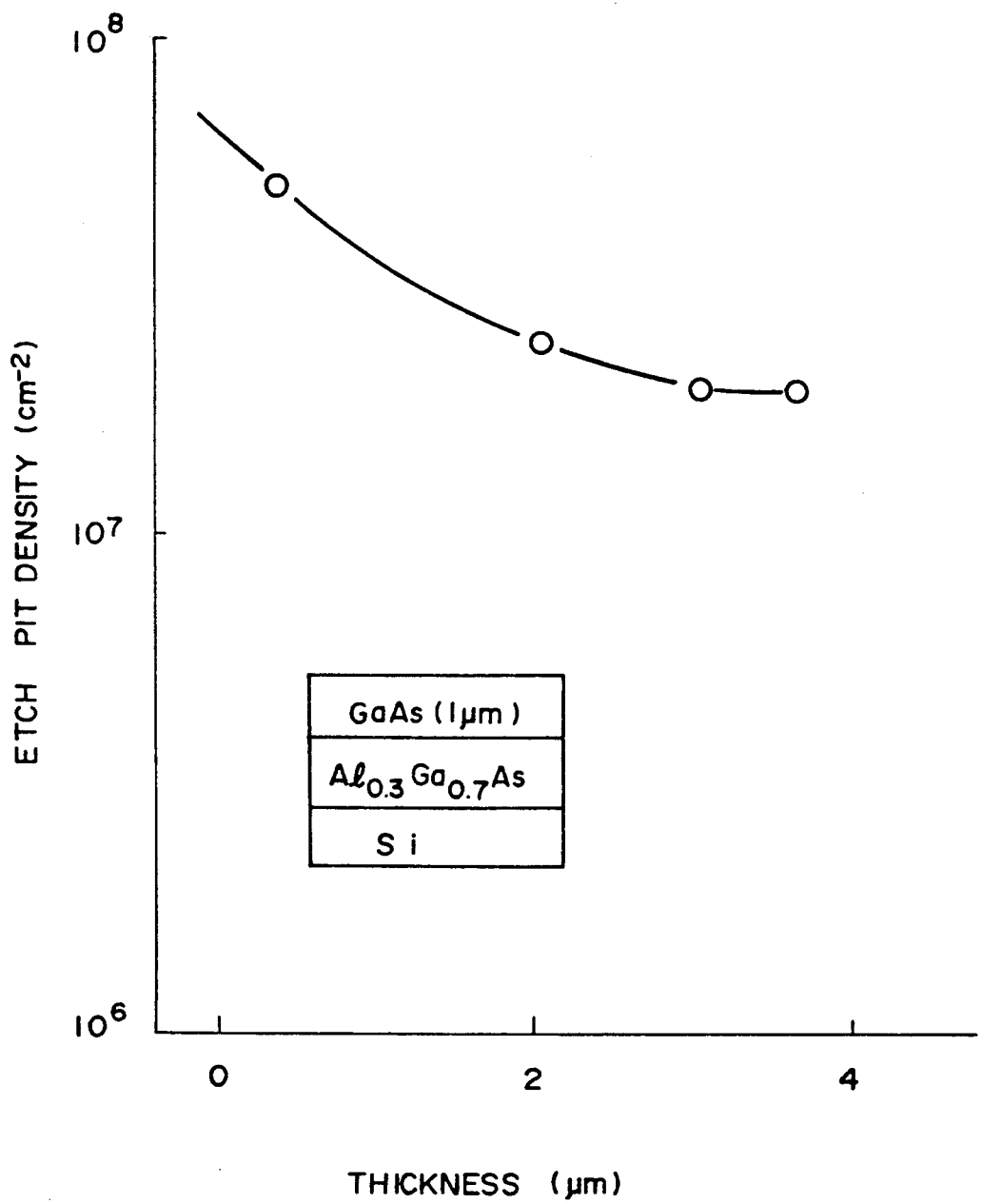

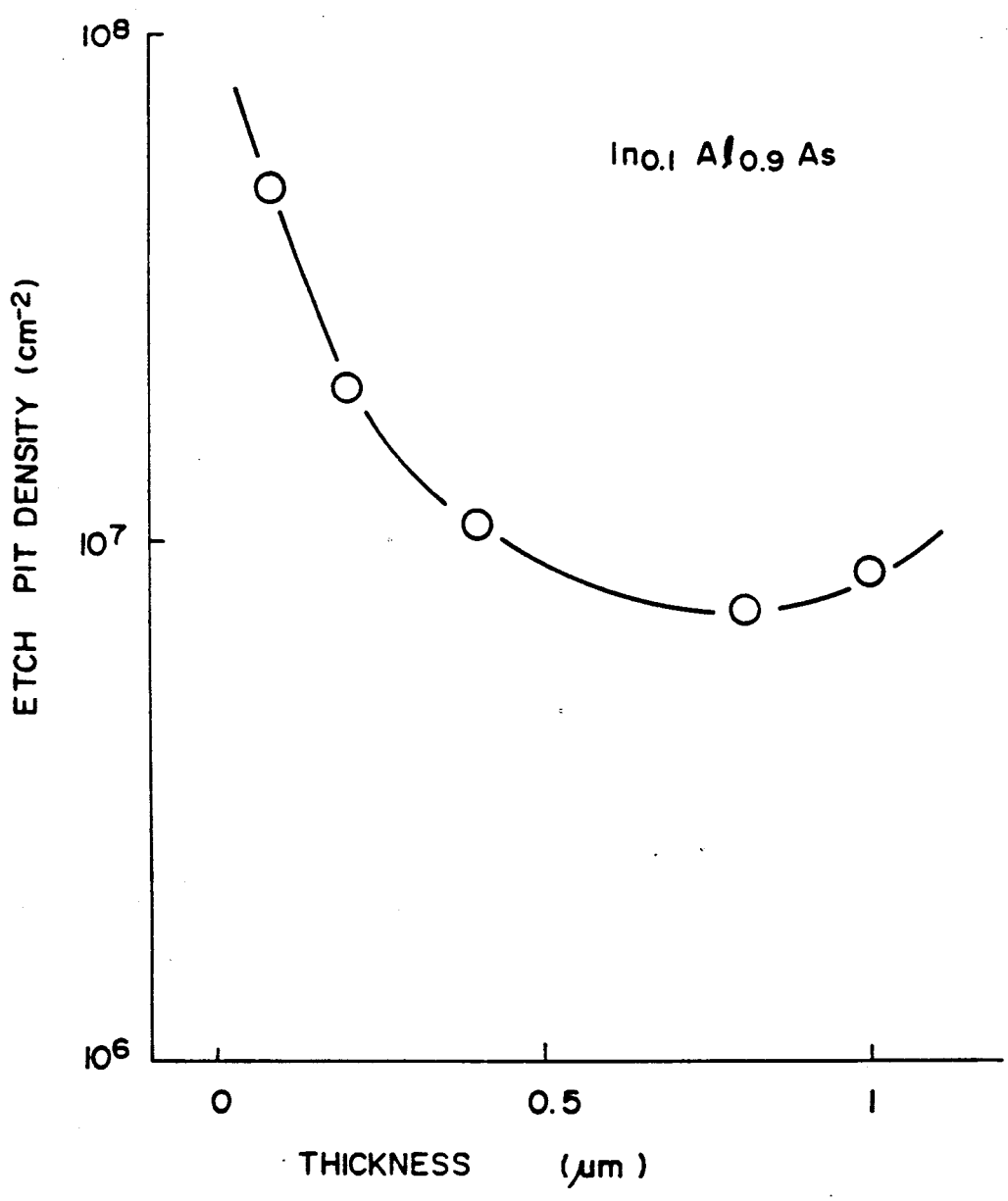

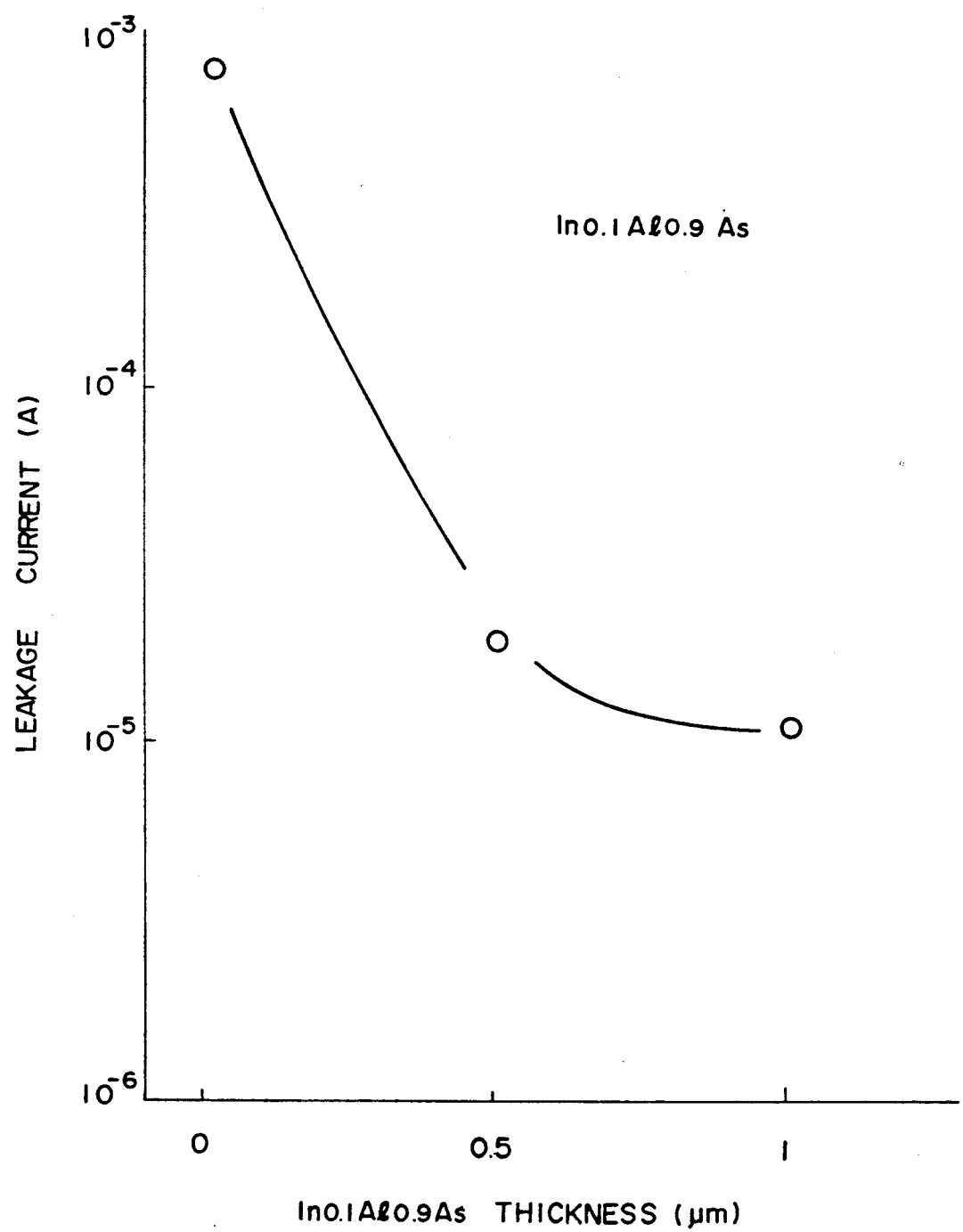

SEMICONDUCTOR DEVICE HAVING A GROUP III-V EPITAXIAL SEMICONDUCTOR LAYER ON A SUBSTRATE

BACKGROUND OF THE INVENTION

The present invention generally relates to semiconductor devices, and in particular to a semiconductor device having a group III-V epitaxial semiconductor layer on a substrate.

The group III-V compound semiconductor materials are characterized by the high electron mobility due to the characteristic band structure pertinent to the material and are suitable for the active layer of fast-speed semiconductor devices. For example, GaAs and the mixed crystals thereof have been studied intensively for realizing such fast-speed devices. Particularly, InGaAs has the band structure that provides a performance superior to other devices constructed on the GaAs active layer in terms of the electron mobility and band structure that minimizes the transition of accelerated electrons from the Γ-valley corresponding to the ground state to other, excited states wherein the electron mobility is smaller. Further, InGaAs forms a two-dimensional electron gas when combined with other appropriate group III-V compound semiconductor layer with sufficient electron density. The latter feature is particularly advantageous for forming a device called HEMT (Miura et al., Jpn. J. Appl. Phys., 19, pp. L225–L227, 1980). Thus, this material is expected to play a major role in the future ultra-fast semiconductor devices.

On the other hand, there is a demand, in such a group III-V super-fast semiconductor devices, for a large diameter wafer to reduce the cost of the fabricated device. Thereby, a technique for producing such a large diameter wafer from the group III-V compound semiconductor material is needed. Conventionally, the production of such a large size wafer has been achieved either by growing a large diameter bulk crystal and slicing the wafer therefrom, or by growing a desired layer of group III-V compound semiconductor material on a commonly available large diameter silicon wafer. As the former approach encounters various difficulties such as difficulty in growing a large diameter bulk crystal of group III-V compound semiconductor material from the melt or difficulty in handling the heavy and brittle wafer, the latter approach of growing the group III-V compound semiconductor layer on the light and strong silicon wafer seems to be a more realistic solution. It should be noted that the production of large diameter silicon wafer is well established.

In taking up the latter approach, however, there arises a problem of discrepancy in the crystallographic as well as other physical properties between the group III-V compound semiconductor material and silicon. For example, the lattice constant of GaAs is about 4% larger than that of silicon while the thermal expansion coefficient of GaAs is larger by more than 200% than that of silicon. Thus, a simple epitaxial growth of GaAs or other group III-V compound semiconductor material on a silicon wafer is generally not successful.

This problem of heteroepitaxial growth of the group III-V compound semiconductor material on silicon has been solved by interposing a layer of amorphous GaAs between the silicon wafer and the group III-V compound semiconductor layer to be grown on the wafer (Akiyama M. et al., J. Cryst. Growth, vol. 68, no. 21, 1984).

On the other hand, the group III-V compound semiconductor layer thus obtained generally involves substantial amount of dislocations and other defects that are formed in the amorphous GaAs buffer layer. It should be noted that these dislocations are created at the boundary between the wafer and the buffer layer at the time when the amorphous layer is crystallized (Akiyama et. al., op cit). Once created, the dislocations propagate into the group III-V compound semiconductor layer, passing through the buffer layer that includes a nucleation layer. Because of this, the dislocation density in the group III-V compound semiconductor layer is intolerably high, in the order of $10^8 cm^{-2}$ or more. Such a material is useless for the active layer of the high speed semiconductor devices.

In addition to the problem of dislocations, the semiconductor devices formed on the foregoing heteroepitaxial structure has a problem of excessive leakage current flowing from the active layer to the substrate. When such leakage current flows, the electric isolation of devices on the substrate is naturally deteriorated. When the leakage current is large enough to cause poor device isolation, the substrate can no longer used for the substrate of integrated circuits. Further, there occurs an interference between adjacent devices known as the "side gate effect." For example, the threshold voltage of a device such as MESFET may change by the gate voltage applied to an adjacent device.

In order to avoid such undesirable interference, the conventional III-V semiconductor layers on the substrate employ undoped GaAs for the buffer layer to secure a high resistivity. Alternatively, there has been practiced to provide a reversely biased p-n junction between the active layer and the substrate. However, such a measure cannot reduce the leakage current below about $10^{-3}$ amperes, which is not satisfactory for the substrate to be used for the compound semiconductor integrated circuits.

SUMMARY OF THE INVENTION

Accordingly, it is a general object of the present invention to provide a novel and useful semiconductor device and a heteroepitaxial substrate therefore, wherein the foregoing problems are eliminated.

Another and more specific object of the present invention is to provide a semiconductor device having a heteroepitaxial layers on a substrate, wherein propagation of dislocations to an active layer of the semiconductor device from the heteroepitaxial interface between the heteroepitaxial layer and the substrate is minimized.

Another object of the present invention is to provide a semiconductor device having a heteroepitaxial layer on a substrate, wherein the leakage current flowing from an active layer of the semiconductor device to the substrate is minimized.

Another object of the present invention is to provide a semiconductor device comprising a substrate of silicon, a buffer layer of a first group III-V compound semiconductor material provided on the substrate, a barrier layer of a second group III-V compound semiconductor material different from the first group III-V compound semiconductor material, provided on the buffer layer in contact therewith, said barrier layer having a resistivity higher than that of the buffer layer and a lattice constant different from that of the buffer layer, an active semiconductor layer provided on the barrier layer, and an active semiconductor device formed in said active semiconductor layer. According to the present invention, the dislocations created at the boundary between the substrate and the buffer layer are intercepted by the barrier layer that has the lattice constant different from the lattice constant of the buffer layer. It should be noted that a strain develops in the barrier layer because of the lattice mismatch between the buffer layer and the barrier layer. The strain thus induced near the boundary reduces the dislocations that have propagated from the boundary between the substrate and the buffer layer to the barrier layer. Further, the leakage current flowing from the active layer to the substrate through the buffer layer is effectively blocked by the high resistivity of the barrier layer. Preferably, the barrier layer comprises a group III-V compound semiconductor material having a wide band gap such as InAlAs or AlGaAs that may be not doped by impurities or that may be doped to form deep impurity levels. Thereby, an effective isolation of the active layer from the substrate can be achieved.

Other objects and further features of the present invention will become apparent from the following detailed description when read in conjunction with the attached drawings.

BRIEF DESCRIPTION OF THE DRAWINGS

FIG. 2 is a graph showing the reduction in the dislocation density achieved by the heteroepitaxial structure of FIG. 1 wherein AlGaAs is used for the barrier layer;

FIG. 3 is a graph showing the reduction in the dislocation density achieved by the heteroepitaxial layers on a substrate structure of FIG. 1 wherein InAlAs is used for the barrier layer;

FIG. 6 is a graph showing the reduction of the leakage current achieved in the HEMT of FIG. 5(D)

DETAILED DESCRIPTION

Figure 1:
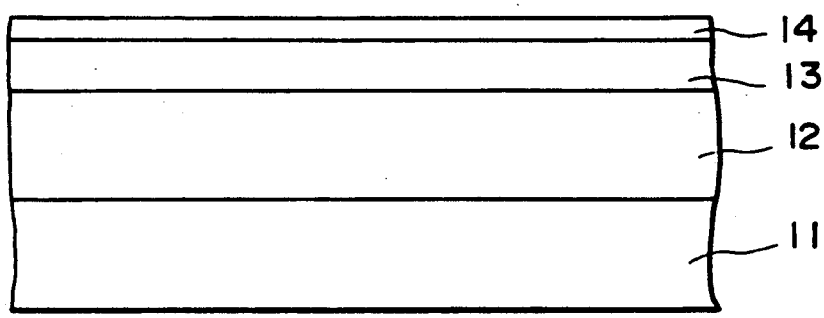
FIG. 1 is a diagram showing the structure of an element which includes heteroepitaxial layers on a substrate that is used for the substrate of the semiconductor device according to a first embodiment of the present invention.

FIG. 1 shows the fundamental structure of an element which includes heteroepitaxial layers on a substrate proposed according to a first embodiment of the present invention.

Referring to FIG. 1, the substrate comprises a silicon base layer 11 on which a buffer layer 12 of GaAs or GaP is grown heteroepitaxially. As is well known and as described previously (Akiyama et al. op cit.). Typically, the GaAs layer 12 is grown with the thickness of about 1-2 $\mu$m.

On the buffer layer 12, a barrier layer 13 of undoped AlGaAs, InAlAs or GaP, forming the essential part of the present invention and having the composition of $Al_xGa_{1-x}As$ or $In_yAl_{1-y}As$, is grown, typically with a thickness of 0.5 $\mu$m. Further, an active layer 14 in which the active part of the semiconductor devices is to be formed, is grown on the barrier layer 13. In this case, the lattice mismatch between the layer 13 and the layer 14 is too small to create the dislocations at the boundary.

It should be noted that the barrier layer 13 has a band gap that is substantially larger than the band gap of GaAs forming the buffer layer 12. For example, AlGaAs having the composition of $Al_{0.3}Ga_{0.7}As$, has the band gap of about 1.65 eV while GaAs has the band gap of 1.43 eV. Similarly, InAlAs having the composition of $In_{0.1}Al_{0.9}As$, for example, has the band gap of about 1.98 eV. GaP, on the other hand, has the band gap of 2.26 eV. Thus, the barrier layer 13 acts as a barrier against the carriers moving therethrough from the active layer 14 to the substrate 11.

In order that the barrier layer 13 acts as the effective barrier of carriers, it is essential that the barrier layer has a large resistivity at least larger than that of the buffer layer 12, in addition to the large band gap. Thus, the barrier layer 13 of the foregoing composition is grown in the undoped state. Such a material generally has the resistivity of more than 50 $\Omega$cm. Alternatively, the barrier layer 13 may be doped with a deep dopant such as Cr that causes a deep impurity level in the forbidden band of the barrier layer 13. When doped as such, the barrier layer 13 may show the resistivity of about 100 $\Omega$cm or more.

Further, it should be noted that the barrier layer 13 has a lattice constant that differs slightly from that of the buffer layer 12. For example, AlGaAs having the foregoing composition has the lattice constant of about 5.66 Å while GaAs has the lattice constant of 5.654 Å. This minute difference in the lattice constant is enough to induce a strain at the interface between the buffer layer 12 and the barrier layer 13, and the dislocations created at the interface between the buffer layer 12 and the substrate 11 and propagating upward through the buffer layer 12, is effectively reduced. In order to achieve the reliable epitaxial growth of the barrier layer 13 on the buffer layer 12, the discrepancy in the lattice constant between the barrier layer 13 and the buffer layer 12 is preferred to be less than 10%, most preferably less than about 5%. A similar reduction of the dislocations can be achieved when the InAlAs barrier layer is used. It should be noted that InAlAs having the foregoing composition has the lattice constant of about 5.70 Å.

Thus, by interposing the barrier layer 13 between the buffer layer 12 and the active layer 14, successful electric isolation of the active layer 14 including the active devices formed thereon against the substrate as well as the effective elimination of dislocations from the active layer 14 are achieved. As long as the barrier layer 13 provides the foregoing isolation and elimination of dislocations is achieved, the material of the layer 13 is not limited to AlGaAs or InAlAs of the specified composition, but a mixed crystal thereof may be used. Further, any other material having a large band gap, high resistivity and a lattice constant that differs from the lattice constant of the buffer layer but matches to the lattice constant of the active layer, may be employed for the barrier layer 13.

FIG. 2 shows the result of etch pit density measurement undertaken for the heteroepitaxial layer grown on the substrate of FIG. 1 wherein a GaAs layer having a thickness of 1 μm is grown on the foregoing AlGaAs barrier layer having various thicknesses. The etch pit density represents the dislocation density in the crystal. In the experiment, the GaAs layer was grown with a thickness of 1 μm as the active layer 14 on the AlGaAs barrier layer 13 having the composition of $Al_{0.3}Ga_{0.7}As$ of which thickness is changed from 0.35 μm to 3.6 μm sample by sample. As can be seen, the etch pit density representing the dislocation density in the GaAs active layer 14 decreases with the increasing thickness of the barrier layer 13, demonstrating the effect of interception of the dislocations by the barrier layer 13.

A similar decrease of dislocation density in the GaAs active layer 14 was observed also in the case where InAlAs having the composition $In_{0.1}Al_{0.9}As$ was used for the barrier layer 13 as shown in FIG. 3. In this case, too, the GaAs active layer 14 was grown with the thickness of 1 μm, while the thickness of the barrier layer 13 was changed from 0.08 μm to 1 μm. As can be seen, the etch pit density decreases with increasing thickness of the barrier layer 13 and has a minimum at the thickness of about 0.8 μm.

Figure 4:
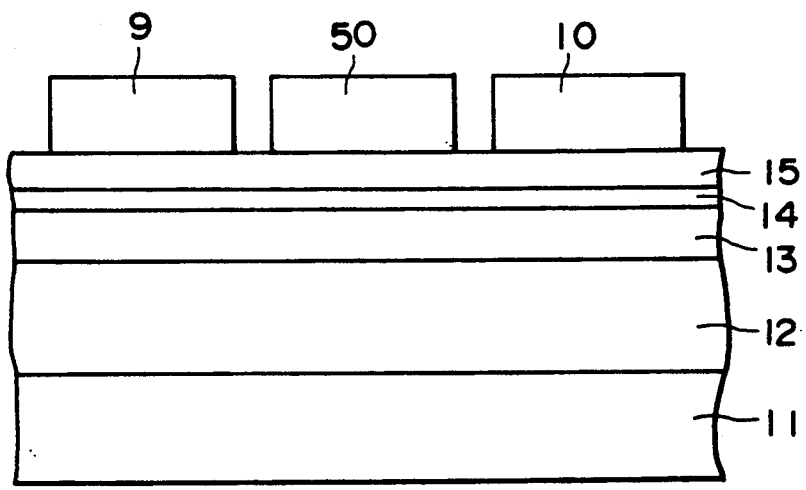
FIG. 4 is a diagram showing the structure of a HEMT formed on the heteroepitaxial layers on a substrate of FIG. 1 according to a second embodiment of the present invention.

Next, a second embodiment of the present invention for a semiconductor device formed on the heteroepitaxial layer grown on a substrate of FIG. 1 will be described with reference to FIG. 4. In FIG. 4, those parts that correspond to the parts already described with reference to FIG. 1 are designated by the same reference numerals and the description thereof will be omitted.

Referring to FIG. 4, the semiconductor device forms an HEMT that utilizes the two-dimensional carrier gas formed at the heteroepitaxial interface between the active layer 14 and a doped layer 15 that is provided on the active layer 14. The active layer 14 may be made of undoped InGaAs and the doped layer 15 may be made of n-type AlGaAs or n-type InAlAs. As the doped layer 15 has a large band gap corresponding to the band gap of the barrier layer 13, there occurs an effective confinement of electrons in the active layer 14. In order to inject the electrons into the two-dimensional electron gas at the heterojunction interface, a source electrode 9 and a drain electrode 10 are provided on the doped layer 15 with an intervening gate electrode 50 provided between the source electrode 9 and the drain electrode 10 for establishing a Schottky contact to the layer 15.

In such a structure of HEMT that utilizes InGaAs for the active layer, a very small effective mass is achieved for the electrons. Further, as the active layer and the doped layer thereon are electrically isolated from the buffer layer 12 and the substrate 11 underneath, the problem of leakage current is significantly reduced. Associated therewith, the mutual conductance of the device is increased. This effect achieved by the present invention will be described with reference to the third embodiment of the present invention to be described below with reference to FIGS. 5(A)-5(D).

Figure 5A:
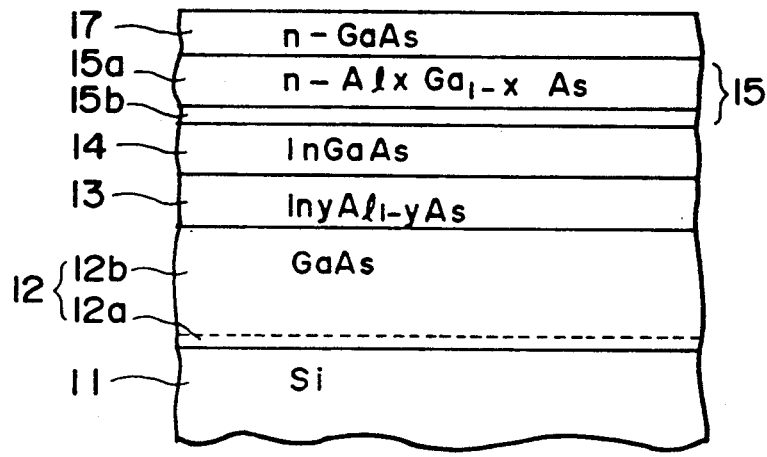
FIGS. 5(A)-5(D) are diagrams showing a part of the structure of an HEMT formed on the heteroepitaxial layer on a substrate of FIG. 1 according to a third embodiment of the present invention and the fabrication process thereof.
Figure 5B:
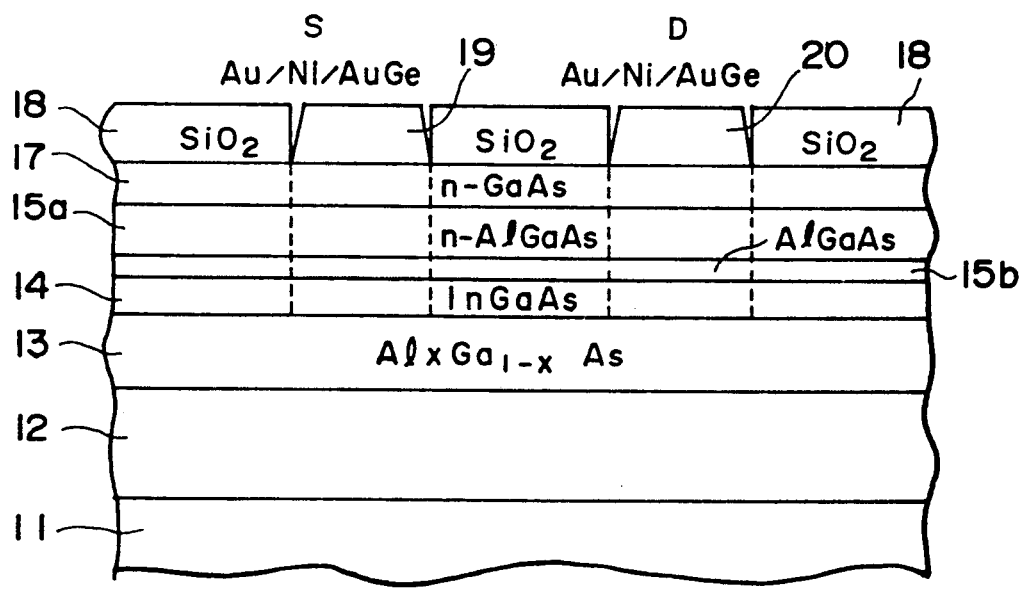
Figure 5C:
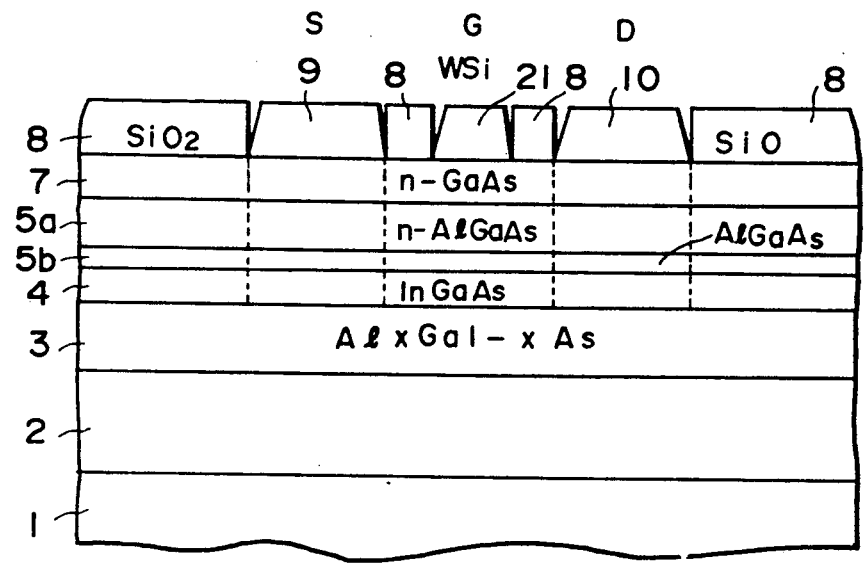
Figure 5D:
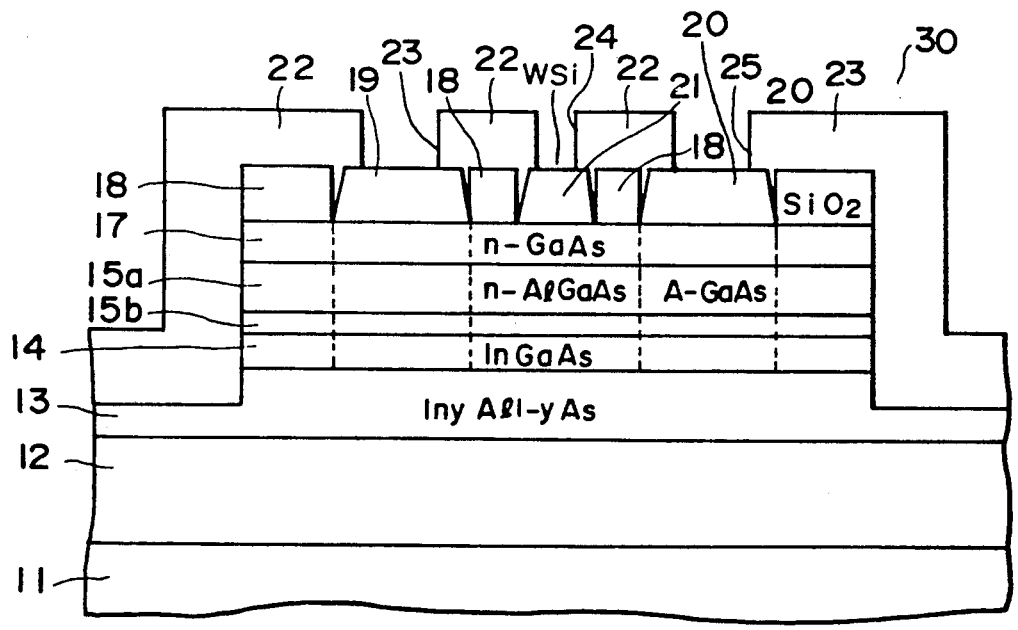

FIGS. 5(A)-5(D) show the process for fabricating a HEMT according to the third embodiment of the present invention, wherein FIG. 5(D) shows the structure of the completed device. In the description below, those parts that have been described previously with reference to the preceding drawings are designated by the same reference numerals and the description thereof will be omitted.

Referring to FIG. 5(A) showing the structure of a layered semiconductor body that forms the essential part of HEMT, the buffer layer 12 of GaAs has a first part 12a immediately above the silicon substrate 11 and a second part 12b grown subsequently on the first part 12b. As will be described later with reference to the process of fabrication, the part 12a is grown in the amorphous state at the beginning of deposition of the buffer layer 12b, and the part 12b is grown after the part 12a is crystallized as a result of increase of the temperature.

On the buffer layer 12, the barrier 13 having the composition $Al_{0.3}Ga_{0.7}As$ is grown epitaxially with the thickness of 0.5 μm. On the barrier layer 13, the active layer 14 of $In_{0.1}Ga_{0.9}As$ is grown epitaxially with a thickness of 100-1000 Å as the channel layer of the semiconductor device. Further, the doped layer 15 of $Al_{0.3}Ga_{0.7}As$ is provided on the active layer 14 to form the two-dimensional electron gas in the layer 14 along the heterojunction interface between the layer 14 and the layer 15. In order to reduce the effect of attenuation of movement of the electrons in the active layer 14, that is caused by the interaction of the electron wave function extending beyond the boundary of the active layer 14 with the dopants in the doped layer 15, the doped layer 15 has a thin undoped region 15b along the heterojunction interface. The thickness of the layer 15b may be about 30-100 Å. The remaining, doped region of the layer 15 is designated by a reference numeral 15a. The region 15a and the region 15b have the same composition of $Al_{0.3}Ga_{0.7}As$ except that the former is doped to the n-type while the latter is not doped. Further, on the layer 15, a cap layer 17 of n-type GaAs is grown epitaxially for facilitating the ohmic contact.

The layered semiconductor body thus formed is subjected to a process for forming a mesa structure 30 as shown in FIG. 5(D) such that the mesa structure 30 extends upward from an intermediate level of the barrier layer 13. Thus, the mesa structure 30 includes the upper half of the barrier layer 13 and the layers 14–17 grown thereabove. On the cap layer 17 of the mesa structure 30, ohmic electrodes 18 and 19 of Au/Ni/AuGe structure are provided as the source and drain electrodes, and a Schottky electrode 21 of WSi is provided between the electrodes 18 and 19 as the gate electrode. Further, the entire surface of the HEMT is covered by a silicon oxide passivation film 22 except for contact holes 23, 24 and 25 respectively exposing the source electrode 18, the gate electrode 21 and the drain electrode 19.

It should be noted that such a mesa structure 30 isolates the devices formed thereon electrically from other devices formed on other mesa structures, as the semiconductor layers 14–17 in the mesa 30 are completely separated from those of other mesa structures by the barrier layer 13. The barrier layer 13 that extends between different mesas has a high resistivity because of the large band gap, and the electric interference between the different devices via the barrier layer 13 or the layers such as the buffer layer 12 or the substrate 11 located below the barrier layer 13 is effectively eliminated.

FIG. 6 shows the leakage current measured about the structure of FIG. 5(D). The measurement was made by measuring the current flowing between the source and drain in the turned-off state of the HEMT. A number of samples were prepared with the substantially identical structure but changing thickness of the barrier layer 13. As can be seen clearly from FIG. 6, the leakage current decreases to about 1/100, as compared to the case where no barrier layer 13 is provided, when the barrier layer 13 is formed with the thickness of 1 μm. Further, it was shown that the mutual conductance of HEMT, having the normalized gate length of 2–10 μm, is improved from 180–230 mS/mm to 250–270 mS/mm by the provision of the barrier layer 13. These findings clearly indicate the effect of electrical isolation achieved by the barrier layer 13.

Next, the process for forming the structure of FIG. 5 will be described. In this process, a silicon substrate having a (100) surface that is offset in the direction by 2 degrees is used for the substrate 11. The substrate 11 is at first treated in a HF solution and washed by water. Next, the substrate 11 is placed on a susceptor in a reactor of which pressure is held at 76 Torr. Further, the substrate 11 is heated at 1000° C. while flowing hydrogen and arsine (AsH$_3$) respectively with the flow rate of 12 SLM and 30 SCCM. Thereby, the oxide film covering the silicon substrate 11 is dissolved by HF and subsequently sublimated in the reactor. In the entire process for growing the layered semiconductor body of FIG. 5, the flow rate of hydrogen is set at 12 SLM. Arsine is introduced for creating an atmosphere containing arsenic for facilitating the growth of GaAs film that is undertaken in the subsequent steps.

Next, the temperature of the substrate 11 is set at 450° C. and arsine and TMG (trimethyl gallium) are introduced in to the reactor with the flow rate of 0.2 SLM and 13.3 SCCM, respectively. Thereby, the GaAs layer 12a is grown in the amorphous state with the thickness of 50–200 Å. Next, the temperature is raised to 650°–700° C. and the amorphous layer 12a is crystallized to a single crystal phase as described previously. Further, the flow rate of the arsine and TMG is set to 0.1 SLM and 2.67 SCCM and the growth of the buffer layer 12 is continued until the part 12b thereon reaches the thickness of about 1.2 μm.

After the buffer layer 12 is thus grown, TMA (trimethyl aluminum) is added to the foregoing source gas of TMG and arsine with the flow rate of 1.1 SCCM and the barrier layer 13 is grown with the thickness of 0.5 μm.

When the growth of the barrier layer 13 is completed, the supply of TMG is reduced and supplying of TMI (trimethyl indium) is started with the flow rate of 1.27 SCCM. Thereby, the active layer 14 of InGaAs having the composition In$_{0.1}$Ga$_{0.9}$As is grown with the thickness of 100–200 Å. After the active layer 14 is grown with the predetermined thickness, the supply of TMI is stopped and the supply of TMG is resumed with the flow rate of 2.67 SCCM. Thereby the layer of undoped AlGaAs forming the spacer layer 15b is grown with the thickness of 30–50 Å. After the spacer layer 15b is grown, silane (SiH$_4$) is added to TMI with the flow rate of 0.0001–0.1 SCCM as the source of silicon that acts as the dopant. Thereby, the layer 15a forming the major part of the doped layer 15 is formed with the thickness of 200–400 Å. The doped layer 15a thus grown has the carrier density of $10^{17}-10^{18}$ cm$^{-3}$. After the layer 15 is grown as such, the growth of the cap layer 17 is started by stopping the supply of TMA while continuing the supply of TMG and arsine. When the layer 17 is grown with the thickness of 100–500 Å, the formation of the layered structure shown in FIG. 5(A) is completed.

After the completion of the structure of FIG. 5(A), a silicon oxide layer 18 is deposited on the top surface of the cap layer 17 as shown in FIG. 5(B) by a CVD process using silane and oxygen at a temperature 350°–450° C. Further, a photoresist (not shown) is deposited on the silicon oxide layer 18 and patterned subsequently to expose the part of the silicon oxide layer 18 corresponding to the source and drain electrodes of HEMT. After an etching process for removing the exposed part of the silicon oxide layer 18, metal layers of gold-germanium alloy, nickel and gold are deposited consecutively to fill the contact holes formed in the silicon oxide layer 18 in correspondence to the source and drain electrodes. Further, after the removal of the photoresist together with the metal layers deposited thereon, the metal layers left on the cap layer 17 care subjected to an alloying process at 400°–450° C., and thereby the source electrode 19 and the drain electrode 20 forming the ohmic contact with the GaAs cap layer 17 are formed as shown in FIG. 5(B). It should be noted that, in the structure of FIG. 5(B), the surface of the cap layer 17 that is not covered by the source and drain electrodes 19 and 20 is still covered by the silicon oxide layer 18.

Next, a photoresist is applied again on the structure of FIG. 5(B) and, after the photolithographic patterning of the photoresist, the part of the silicon oxide layer 18 corresponding to where the gate electrode 21 is to be formed is subjected to etching for forming a contact hole for the gate electrode. After the etching, a sputtering process of Wsi is accomplished such that the contact hole corresponding to the gate electrode is filled by WSi. With the removal of the remaining photoresist, the structure shown in FIG. 5(C) is obtained.

Further, the structure of FIG. 5(C) is subjected to the mesa etching for forming the mesa structure 30. As already described, the mesa structure 30 is formed to extend upward from an intermediate level of the barrier layer 13 as shown in FIG. 5(D). Further, the entire surface of the mesa structure 30 including the side wall portion of the mesa 30 is covered by the silicon oxide passivation layer 22 that is deposited by the CVD process. After providing the contact holes 23, 24 and 25 in the passivation layer 22 in correspondence to the source electrode 19, the gate electrode 21 and the drain electrode 20, fabrication of the HEMT is completed.

Figure 7:
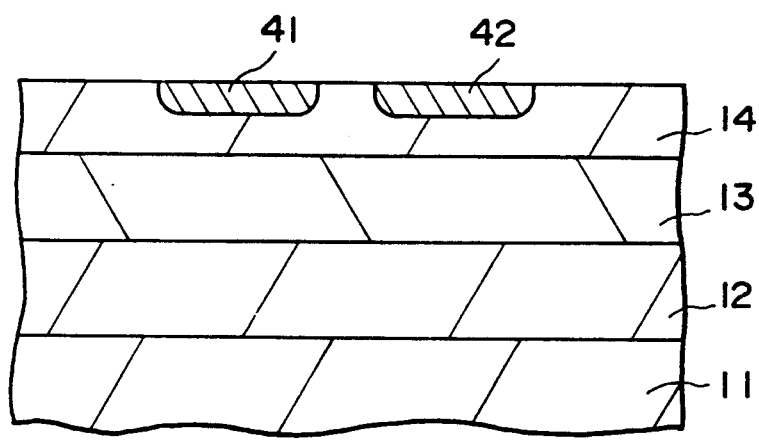
FIG. 7 is a diagram showing the structure of a heterojunction bipolar transistor formed on the substrate of FIG. 1.

FIG. 7 shows a hetero-bipolar transistor according to a fourth embodiment of the present invention. Referring to FIG. 7, the GaAs buffer layer 12 and the barrier layer of AlGaAs or InAlAs are grown on the substrate 11 consecutively as already described, and the active layer of InGaAs 14 is grown on the barrier layer 13. In the active layer 14 is doped for example to the n-type and forms the base of a bipolar transistor. Further, p-type regions 41 and 42 are formed in the active layer 14 by ion implantation as the emitter and source. Thereby, a high-speed bipolar transistor is formed.

In the description heretofore, it has been assumed that the buffer layer 12 is formed from GaAs. However, other group III-V compound semiconductor materials such as GaP may also be used for the buffer layer 12. It should be noted that GaP has the lattice constant of 5.4514 Å and shows a lattice discrepancy of 0.37% against silicon. Thereby, an excellent epitaxial growth on the silicon wafer 11 is possible. Further, GaP has a high resistivity of about $10^2$ Ωcm and is suitable for the buffer layer. The mixed crystal of GaAsP may also be used for the buffer layer.

Further, it should be noted that the number of barrier layers 13 between the buffer layer 12 and the active layer 14 is not limited to one but a plurality of structures comprising the buffer layer 12 and the barrier layer 13 may be provided between the substrate 11 and the active layer 14.

Further, the substrate of the present invention is not limited to silicon but germanium or aluminum oxide may be used.

Further, the present invention is not limited to the embodiments described heretofore, but various variations and modifications may be made without departing from the scope of the invention.

What is claimed is:

1. In a semiconductor device,
    a substrate of a first material having an upper major surface and a lower major surface, said first material comprising a material having crystallographic discrepancies relative to a group III-V semiconductor compound to be epitaxially grown thereon such that a potential for propagation of dislocations and leakage of current generally exists;
    a buffer layer having an upper major surface and a lower major surface and comprising a second material, said second material comprising a group III-V compound semiconductor material having a first resistivity, a first lattice constant and a first band gap, said buffer layer being expitaxially grown on the upper major surface of the substrate;
    a barrier layer having an upper major surface and a lower major surface and comprising a third material, said third material comprising a group III-V compound semiconductor material that is different from the second material, said third material having a second resistivity substantially larger than the first resistivity and a second lattice constant different from the first lattice constant, said third material having a second band gap substantially larger than the first band gap, said barrier layer being provided on the upper major surface of the buffer layer such that the upper major surface of the buffer layer makes a contact with the lower major surface of the barrier layer;
    an active layer comprising a fourth material, said fourth material comprising a group III-V compound semiconductor material, said active layer having an upper major surface and a lower major surface and being provided on the upper major surface of the barrier layer; and
    an active device provided on the active layer such that the active device at least has a part formed in the active layer, said active device being provided above the upper major surface of the barrier layer.

2. A semiconductor device as claimed in claim 1 in which said first material is selected from a group consisted of silicon, germanium and aluminum oxide.

3. A semiconductor device as claimed in claim 1 in which said second material is selected from a group consisted of gallium arsenide and gallium phosphide and a mixed crystal thereof.

4. A semiconductor device as claimed in claim 1 in which said third material is selected from a group consisted of aluminum gallium arsenide, indium aluminum arsenide and a mixed crystal thereof.

5. A semiconductor device as claimed in claim 4 in which said third material comprises aluminum gallium arsenide having a composition of about $Al_{0.3}Ga_{0.7}As$.

6. A semiconductor device as claimed in claim 4 in which said third material comprises indium aluminum arsenide having a composition of about $In_{0.1}Al_{0.9}As$.

7. A semiconductor device as claimed in claim 4 in which said third material is an undoped material.

8. A semiconductor device as claimed in claim 4 in which said third material is doped by an impurity element that forms a deep impurity level in the third material.

9. A semiconductor device as claimed in claim 1 in which said active layer comprises an undoped layer of indium gallium arsenide having an upper major surface and a lower major surface that coincides with the lower major surface of the active layer, a doped layer of gallium arsenide having an upper major surface that coincides with the upper major surface and a lower major surface and provided on the undoped layer, first electrode means provided on the upper major surface of the doped layer for injecting carriers into the doped layer, second electrode means provided on the upper major surface of the doped layer with a separation from the first electrode means for recovering the carriers from the doped layer, and third electrode means provided on the upper major surface between the first and second electrodes for controlling a flow of the carriers from the first electrode means to the second electrode means.

* * * * *